(12) United States Patent
Fazelpour et al.

(10) Patent No.: US 6,576,983 B1
(45) Date of Patent: Jun. 10, 2003

(54) CONTROLLED IMPEDANCE LEADS IN A LEADFRAME FOR HIGH FREQUENCY APPLICATIONS

(75) Inventors: Siamak Fazelpour, San Diego, CA (US); Hassan S. Hashemi, Laguna Niguel, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/012,792

(22) Filed: Nov. 13, 2001

(51) Int. Cl.[7] .................. H01L 23/495; H01L 23/52
(52) U.S. Cl. ............. 257/666; 257/787; 257/691; 257/678; 361/813
(58) Field of Search .................. 257/666, 787, 257/691, 678; 361/813

(56) References Cited

U.S. PATENT DOCUMENTS 4,866,571 A * 9/1989 Butt .......................... 361/386
6,469,321 B2 * 10/2002 Arndt ......................... 257/678

FOREIGN PATENT DOCUMENTS

| JP | 4-312963 | * 11/1992 | ................. 257/667 |
| JP | 5-335434 | * 12/1993 | ................. 257/666 |

* cited by examiner

Primary Examiner—Jasmine J B Clark
(74) Attorney, Agent, or Firm—Farjami & Farjami LLP

(57) ABSTRACT

One embodiment comprises a printed circuit board having a cavity. A leadframe having a leadframe paddle and at least one lead is situated with the cavity. A reference plane is situated within the printed circuit board at a predetermined distance below the at least one lead in a manner so as to result in a controlled impedance of the at least one lead. A total lead length of the at least one lead consists of an encased lead length and a free space lead length. By controlling the predetermined distance, the dielectric constant of the mold compound, the dielectric constant of the printed circuit board, the total lead length, the encased lead length, and the free space lead length of the at least one lead, the disclosed embodiment results in a controlled impedance of the at least one lead.

29 Claims, 2 Drawing Sheets

CONTROLLED IMPEDANCE LEADS IN A LEADFRAME FOR HIGH FREQUENCY APPLICATIONS

BACKGROUND OF THE INVENTION

1. Field of the Invention

The present invention is generally in the field of semiconductor packaging. More specifically, the invention is in the field of leadframe packaging.

2. Background Art

A leadframe is used in the fabrication of semiconductor die molded packages and is usually formed from a metal such as copper and includes a paddle which might be secured to the body of the leadframe by, for example, a number of tie bars. The paddle is usually situated at the center of the leadframe. The leadframe also usually comprises a number of leads which are secured to the frame. In an "exposed" paddle leadframe based molded package, the bottom of the paddle is not encapsulated by the molding compound. The metal on the bottom of the paddle of the leadframe is left exposed in order to attach the bottom of the paddle to the printed circuit board during a re-flow solder process.

A die is attached to the top surface of the paddle in a manner known in the art. Respective first ends of bond wires are then bonded to respective die bonding pads. Respective second ends of each bond wire are then spanned to respective inner leads in the leadframe and bonded thereto for making the desired electrical connections. In a subsequent stage of the assembly process, the leadframe is placed in a transfer molding machine and the entire die, bond wires, die bonding pads, and top surface of the paddle are encapsulated in a molding compound.

A leadframe is not typically used in the packaging of high speed applications, such as multi Gigabyte/sec (Gb/s) applications, due to the lack of impedance control and high parasitics of the leadframe leads. Instead, ball grid array (BGA) or flip chip packages are typically used for multi Giga-Hertz (GHz) applications that require controlled impedance for chip-substrate-pin interconnects. Both these existing techniques, i.e. BGA and flip chip packages, are however expensive solutions compared to using a leadframe with an exposed paddle.

If the impedance of interconnect structures are not controlled, then electrical discontinuities, in the form of impedance mismatches, will exist at the interfaces between different interconnect structures. An electrical discontinuity caused by an interconnect structure, which can be thought of as an electrical discontinuity in a transmission line, may have a considerable adverse impact on signal propagation. When a signal enters a transmission line, a portion of the signal might be reflected unless there is a perfect impedance match between the output impedance of the source of the signal and the input impedance of the transmission line. The magnitude of the signal.reflection is proportional to the degree of impedance mismatch. To determine if a particular interconnect structure should be considered a transmission line, the wavelength of the signal propagating through the interconnect structure is compared to the electrical length of the interconnect structure.

Generally, the signal wavelength should be considerably longer than the electrical length of the interconnect structure, or else the interconnect structure must be treated as a transmission line. An approximation used by engineers is that if the electrical length of the interconnect structure is greater than one-tenth ($\frac{1}{10}$) of a given signal wavelength, then the interconnect structure must be treated as a transmission line and an electrical discontinuity is considered to have a significant impact on the signal propagation.

Since the wavelength of a signal through a particular medium is given by the speed of light through that medium divided by the signal frequency, it follows that the signal wavelength decreases with higher frequency signals. As the signal wavelength decreases with higher signal speeds, the maximum electrical length that an interconnect structure can have before it is considered a transmission line also decreases. In the case of broadband applications involving high speed data transmission, signal reflection is of particular concern because electrical lengths of interconnect structures might be too great compared to signal wavelengths and, as such, the problem of impedance mismatches, i.e. electrical discontinuities, is aggravated.

With respect to packaging methods for high speed applications, a conventional leadframe is not desirable because the leadframe leads often act as transmission lines that produce an undesirable level of signal reflection and thereby adversely affect quality and speed of signal propagation. The use of a leadframe, however, offers a considerable cost advantage compared to existing packaging methods for high speed applications, such as BGA or flip chip packages.

Thus there is need for a leadframe based package for high speed data transmission applications.

SUMMARY OF THE INVENTION

The present invention is directed to controlled impedance leads in a leadframe for high frequency applications. The invention addresses and resolves the need in the art for a leadframe based package for high speed data transmission applications.

In one embodiment, the invention comprises a printed circuit board having a cavity formed within the printed circuit board. A leadframe having a leadframe paddle and at least one lead is situated with the cavity. The leadframe might be, for example, an exposed paddle leadframe. In one embodiment, the at least one lead is flush with the top surface of the printed circuit board. A reference plane is situated within the printed circuit board at a predetermined distance below the at least one lead in a manner so as to result in a controlled impedance of the at least one lead. The reference plane can be any plane with a constant DC voltage and no AC component, such as a ground plane.

In one embodiment, the exposed paddle is attached to the ground plane. In one embodiment, the cavity containing the leadframe paddle and a portion of the at least one lead are encased in a mold compound. A total lead length of the at least one lead consists of an encased lead length and a free space lead length. By controlling the predetermined distance, the dielectric constant of the mold compound, the dielectric constant of the printed circuit board, the total lead length, the encased lead length, and the free space lead length of the at least one lead, the invention results in a controlled impedance of the at least one lead.

DETAILED DESCRIPTION OF THE INVENTION

The present invention is directed to controlled impedance leads in a leadframe for high frequency applications. The following description contains specific information pertaining to various embodiments and implementations of the invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention that use the principles of the present invention are not specifically described in the present application and are not specifically illustrated by the present drawings.

Figure 1:
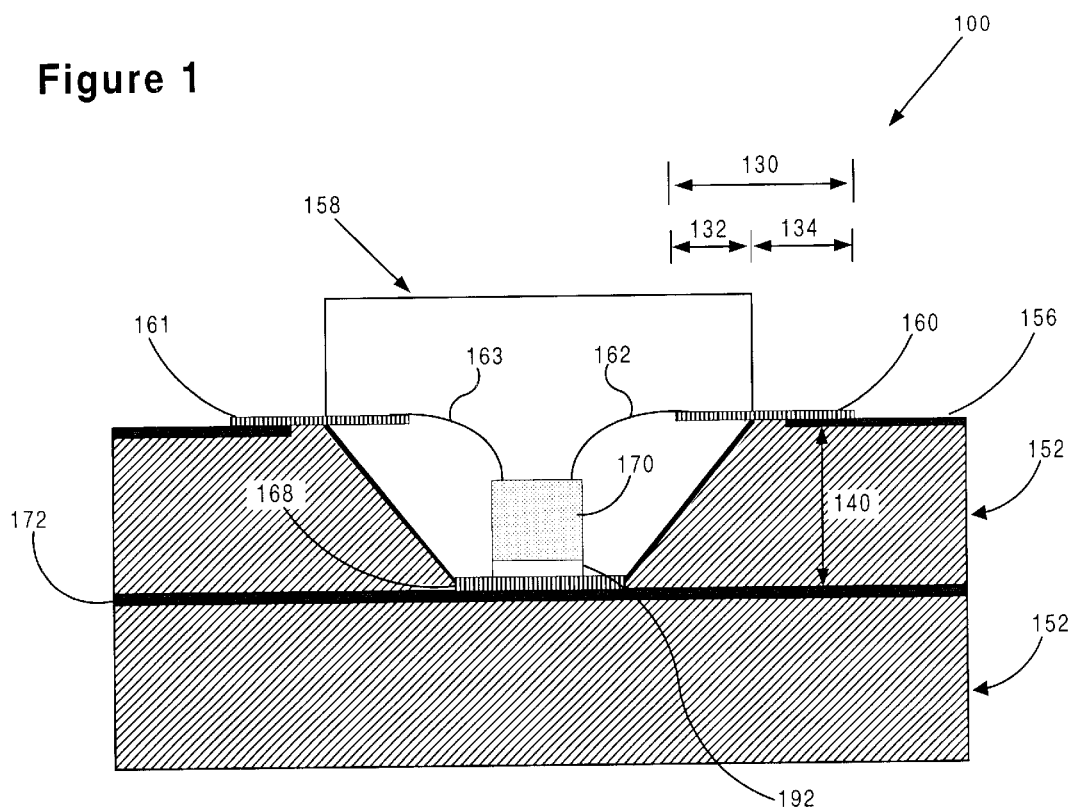
FIG. 1 illustrates a cross section of an exemplary embodiment of the present invention.

FIG. 1 illustrates an exemplary embodiment of the present invention's leadframe package 100. As shown in FIG. 1, mold compound 158 encapsulates die 170, bond wires 162 and 163, exposed paddle 168, and a portion of the leadframe leads, for example, leads 160 and 161. Exposed paddle 168 is also referred to generally as a "leadframe paddle" in the present application. As illustrated in FIG. 1, leads 160 and 161 of leadframe package 100 extend straight out of mold compound 158, and in the present embodiment are flush with the top surface of printed circuit board 152, and can be soldered to the top surface of printed circuit board 152 to their respective pads (not shown in FIG. 1).

Printed circuit board 152 which, in the present example, encloses ground plane 172, houses and protects leadframe package 1.00. It is noted that printed circuit board 152 and mold compound 158 can be considered dielectric materials with associated dielectric constants. For the purpose of the present discussion, the space above mold compound 158 is considered to be "free space" and thus has a dielectric constant equal to one (i.e., $\epsilon=1.0$). It is also noted that ground plane 172 is a specific example of what is generally referred to as a "reference plane" in the present application. In fact, any conductive plane having a constant DC voltage with no AC component can be used as reference pane 172.

According to the present embodiment, a cavity is formed in printed circuit board 152, wherein the bottom of the cavity is defined by a reference plane, i.e. ground plane 172, which runs between two layers of printed circuit board 152. Die 170 is attached to exposed paddle 168, and together, die 170 and exposed paddle 168 are mounted at the bottom of the cavity, where exposed paddle 168 is soldered onto ground plane 172. By way of example, die 170 in leadframe package 100 may be a device such as a high frequency low noise amplifier.

Die 170 is attached by down bonds (not shown in FIG. 1) to exposed paddle 168. The down bonds are used to electrically connect ground bond pads (not shown in FIG. 1) situated on the top surface of die 170 to the grounded exposed paddle 168. Leads 160 and 161 are representative leads among a large number of leads that are not shown in leadframe package 100 of FIG. 1. The length of lead 160 is indicated by total lead length 130. As seen in FIG. 1, a portion of each leadframe lead, e.g. lead 160, is encased in mold compound 158, while the remaining portion is in free space. The portion of lead 160 that is within mold compound 158 is indicated in FIG. 1 by encased lead length 132, while the portion that is in free space is indicated by free space lead length 134. The width of each lead in leadframe package 100, e.g. leads 160 and 161, is not shown in the cross-sectional view of FIG. 1, but is shown in the top view of the leadframe in FIG. 2.

In the exemplary embodiment of FIG. 1, interconnect structure 156 may transmit data at a very high frequency, e.g. in the multi-GHz frequency range, and is also referred to as "high speed line" 156 in the present application. The height of dielectric material between ground plane 172 and high speed line 156 is referred to as distance 140. As seen in FIG. 1, the separation between exposed paddle 168 and lead 160 is also approximately equivalent to distance 140. Therefore, in the present embodiment, distance 140 may also represent the separation between lead 160 and exposed paddle 168. In the present application, distance 140 is also referred to as a "predetermined distance."

As discussed above, an impedance mismatch at the interface of two interconnect structures results in an electrical discontinuity in the signal path that is detrimental to the signal propagation speed and signal quality. Such discontinuities in conventional leadframes occur at the interface of lead 160 and bond wire 162, or the interface of lead 160 and high speed line 156. With respect to lead 160, an impedance mismatch with bond wire 162 or high speed line 156 will cause signal reflections in incoming or outgoing signals, which, as stated above, become more significant at higher signal frequencies. The ratio between total lead length 130 and the wavelength of the signal that propagates through total lead length 130 is a critical parameter in determining whether lead 160 can be considered a transmission line. As the ratio of total lead length 130 to the signal.wavelength increases, so does the adverse impact of the discontinuity on signal propagation speed and quality.

As is known in the art, a structure such as lead 160 can be considered a transmission line if it has an electrical length that is greater than one-tenth of the signal wavelength propagating therethrough. Thus, as the signal frequency increases, i.e. as the wavelength decreases, the electrical length of lead 160 needs to be made correspondingly shorter, otherwise lead 160 will function as a transmission line whose potential impedance mismatch would present a discontinuity in signal propagation. As an illustration, a signal speed of 10 GHz propagating through lead 160 would have a corresponding signal wavelength of approximately 3 cm. One-tenth of this wavelength would be approximately 0.3 cm. Thus, if lead 160 has a length greater than 0.3 cm then it must be treated as a transmission line. It should be noted, however, that this example applies to a signal propagating through free space, where the dielectric constant is equal to one, i.e. $\epsilon=1$.

As stated above, the portion of total lead length 130 that is in free space is shown in FIG. 1 as free space lead length 134, while the portion of lead length 130 that is encased in mold compound 158 is shown as encased lead length 132. Since the wavelength of a signal in a dielectric medium such as mold compound 158 is shorter than it is in free space, the minimum length for consideration as a transmission line decreases accordingly. In other words, per unit of length, encased lead length 132 will have a greater effect on the signal propagation than free space lead length 134. For signals not propagating in free space, the wavelength must be calculated by dividing the free space wavelength by the square root of the dielectric constant ($\epsilon$) of the dielectric material. Assuming that mold compound 158 and printed circuit board 152 both have dielectric constants equal to four (i.e. $\epsilon=4$), a 10 GHz signal traveling through encased lead length 132 would have a wavelength of approximately 3/√4̄=1.5 cm, which sets the minimum length for a transmission line within mold compound 158 at 0.15 cm when divided by ten.

If lead 160 acts as a transmission line, then the signal propagation speed and quality may be adversely affected unless lead 160 is designed to have a controlled impedance. As discussed below, the present invention achieves a novel control over the impedance of the leadframe leads, such as lead 160. As also discussed below, because leadframe package 100 is used in high frequency applications, the leads of the leadframe act as transmission lines; however, in accordance with the present invention, the leads of the leadframe in leadframe.package 100, such as lead 160, have controlled and defined impedances.

According to the present invention, the impedance of lead 160 in leadframe package 100 is controlled by adjusting the distance between lead 160 and a "ground return path." The ground return path of lead 160 is established by the relationship between lead 160 and an electrical ground, such as ground plane 172. By adjusting the dimensions and position of lead 160 relative to ground plane 172, the ground return path of lead 160 is adjusted such that lead 160 has a defined impedance. Referring to FIG. 1, distance 140 is used in defining the impedance of lead 160. Lead 160 forms a magnetic field loop with ground plane 172, where the strength of the magnetic field loop is directly proportional to distance 140. Furthermore, since the impedance of lead 160 is directly proportional to the strength of this magnetic field loop, it follows that the impedance of lead 160 is directly proportional to distance 140.

As stated above, distance 140, the distance from lead 160 to ground plane 172, also represents the thickness of dielectric materials, i.e. mold compound 158 and printed circuit board 152, between lead 160 and ground plane 172. As stated above, the impedance of lead 160 can be varied by adjusting distance 140 in leadframe package 100. The impedance of lead 160 can also be affected by the dielectric constants of mold compound 158 and printed circuit board 152 as well as by the width of lead 160. Thus, by determining distance 140, lead encased lead length 132, free space lead length 134, and dielectric materials for mold compound 158 and printed circuit.board 152, and the width of lead 160, the impedance of lead 160 in leadframe package 100 can be controlled. And by controlling the impedance of lead 160, the present invention eliminates impedance mismatching at the interface of lead 160 and high speed line 156 and similarly at the interface of lead 160 and bond wire 162.

In a departure from conventional techniques, the present invention houses the semiconductor die, such as die 170 in FIG. 1, in a cavity specially created in printed circuit board 152, as opposed to simply surface mounting the semiconductor die on printed circuit board 152. According to the present invention, the dimensions of the cavity created within printed circuit board 152 and the position of ground or reference plane 172 within printed circuit board 152 are defined in a manner so as to result in a controlled impedance of the leadframe leads, such as lead 160. By determining the depth of the cavity within which leadframe package 100 is housed and by placing ground plane 172 at that depth, the impedance of the leadframe leads, such as lead 160, is properly controlled while exposed paddle 168 is also provided with a ground plane through which ground is provided to die 170.

As stated above, another factor that affects the depth of the cavity within which leadframe package 100 is formed and housed, are the dielectric constants of mold compound 158 and printed circuit board 152. Thus, distance 140 is affected by the desired depth of the cavity within which leadframe package 100 is formed and housed and the dielectric constants of mold compound 158 and printed circuit board 152. As such, the impedance of the leadframe leads, such as lead 160, are controlled by appropriately controlling the depth of the cavity, i.e. distance 140, and by placing a ground plane in a printed circuit board having the desired dielectric constant at the exact desired depth 140, as well as by utilizing a mold compound having a desired dielectric constant. Moreover, by adjusting the width of each lead, such as lead 160, impedance of each lead is further controlled. In this manner, impedance control of leadframe leads, such as lead 160 is achieved while the leads behave as transmission lines due to the high frequency applications in which leadframe package 100 is employed.

Figure 2:
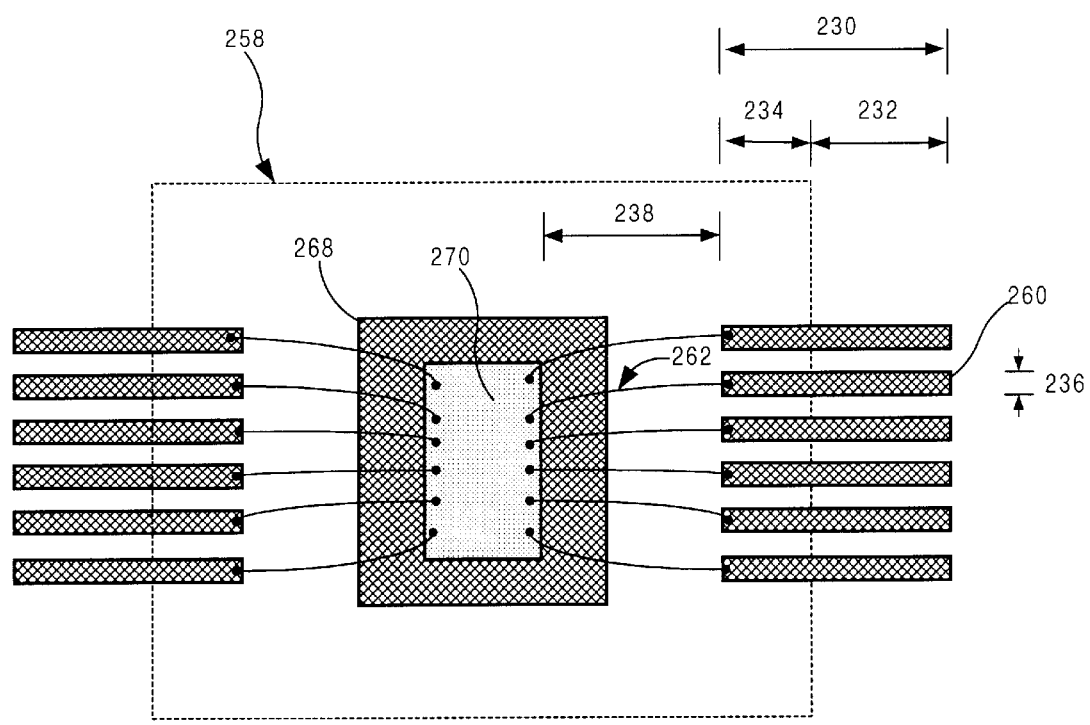
FIG. 2 illustrates a top view of an exemplary embodiment of the present invention.

FIG. 2 illustrates an exemplary top view of the present invention in accordance with one embodiment. FIG. 2 corresponds to a top view, looking through mold compound 158, of leadframe package, 100 with exposed paddle 168 from FIG. 1. Die 270 and exposed paddle 268 of FIG. 2 correspond to die 170 and exposed paddle 168 of FIG. 1, respectively. As shown in FIG. 2, die 270 is connected to leads, e.g. lead 260, through bond wires, e.g. bond wire 262. It is noted that lead 260 and bond wire 262 correspond to lead 160 and bond wire 162, respectively. The area covered by mold compound 158 is represented by mold area 258, also referred to as mold compound 258. Mold compound 258 in FIG. 2 is a top view of mold compound 158 of FIG. 1.

As shown, in the present embodiment of the invention, a portion of each lead is encased within mold compound 258, while the remaining portion is outside mold compound 258. For the purpose of the present discussion, the medium outside of mold compound 258 will be considered to be free space. The length of the leads, e.g. lead 260, is designated by total lead length 230 which corresponds to total lead length 130 from FIG. 1. The width of lead 260 is given by lead width 236. Furthermore, lead 260 can be divided into two segments: The segment of lead 260 within mold compound 258 corresponding to encased lead length 232, and the segment of lead 260 in free space corresponding to free space lead length 234. Thus, the sum of encased lead length 232 and free space lead length 234 equals total lead length 230.

With respect to signal propagation, a signal through encased lead length 232 travels through the portion of lead 260 enclosed by mold compound 258, while a signal through free space lead length 234 travels through the portion of lead 260 situated in free space. As discussed above, encased lead length 232 is situated at a predetermined distance from a ground plane (not shown in FIG. 2) of the motherboard and has a predetermined lead width 236, such that the impedance of encased lead length 232 is relatively well controlled.

As shown in FIG. 2, each of the leads, e.g. lead 260, is separated by a fixed distance from die 270, which will be referred to as chip-lead separation 238. Bond wire 262 connects lead 160 to the periphery of die 270. The length of bond wire 262 may be approximated by chip-lead separation 238. In an exemplary embodiment, chip-lead separation 238 may be approximately 0.4 mm, and the corresponding length of bond wire 262 would be at least 0.5 mm, for example. In very high frequency applications, e.g. 10 to 40 GHz or above, the bond wires can be considered as transmission lines and affect signal propagation. As such, it is desirable to minimize the lengths of bond wire 262 and chip-lead separation 238.

According to the present invention, the impedance of the leads shown in FIG. 2, e.g. lead 260, can be controlled by also adjusting the lead width, e.g. lead width 236. As discussed above, total lead length 230, corresponding to total lead length 130, determines whether lead 260 acts as a transmission line and can be controlled as such. Lead width 236 and distance 140 (FIG. 1) and the dielectric constants of mold compound 258 and printed circuit board 152 (FIG. 1), however, are determined to arrive at a desired impedance of lead 260 for optimum signal propagation through lead 260, given the impedance of the interfacing bond wire, in this example bond wire 262, and the impedance of high speed line 156 (FIG. 1). In other words, the impedance of the leadframe leads, e.g. lead 260, can be optimally controlled by adjusting lead width 236 according to the height of the leads with respect to the exposed paddle 268, i.e. distance 140 (FIG. 1), and further according to the dielectric materials used for mold compound 258 and printed circuit board 152 (FIG. 1).

It is seen that the present invention can provide improved signal propagation speed and quality through the leads of a leadframe package by providing the leads with defined and controlled impedances. Furthermore, the design of leadframe leads with defined and controlled impedances overcomes a major drawback of previous leadframe packages with respect to signal propagation speed and quality, and allows for the use of leadframe packages in very high frequency applications.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, controlled impedance leads in a leadframe for high frequency applications have been described.

What is claimed is:

1. A structure comprising:
   a printed circuit board having a cavity formed within said printed circuit board;
   a leadframe having a leadframe paddle and at least one lead, said leadframe paddle being situated within said cavity, said lead frame paddle configured to receive a die;
   said at least one lead being flush with a top surface of said printed circuit board;
   a reference plane within said printed circuit board, said reference plane situated at a predetermined distance below said at least one lead so as to cause said at least one lead to have a controlled impedance.

2. The structure of claim 1 wherein said reference plane is a ground plane.

3. The structure of claim 2 wherein said leadframe paddle is an exposed paddle and wherein a bottom surface of said exposed paddle is attached to said ground plane.

4. The structure of claim 2 wherein said printed circuit board has a first desired dielectric constant, said first desired dielectric constant is selected so as to result in said controlled impedance of said at least one lead.

5. The structure of claim 2 wherein said cavity is encased in a mold compound.

6. The structure of claim 5 wherein said mold compound has a second desired dielectric constant, said second desired dielectric constant is selected so as to result in said controlled impedance of said at least one lead.

7. The structure of claim 4 wherein said cavity and a portion of said at least one lead are encased in a mold compound.

8. The structure of claim 7 wherein said mold compound has a second desired dielectric constant, said second desired dielectric constant is selected so as to result in said controlled impedance of said at least one lead.

9. The structure of claim 2 wherein a total lead length of said at least one lead is selected so as to result in said controlled impedance of said at least one lead.

10. The structure of claim 2 wherein an encased lead length of said at least one lead is selected so as to result in said controlled impedance of said at least one lead.

11. The structure of claim 2 wherein a free space lead length of said at least one lead is selected so as to result in said controlled impedance of said at least one lead.

12. The structure of claim 2 wherein a lead width of said at least one lead is selected so as to result in said controlled impedance of said at least one lead.

13. A structure comprising:
   a printed circuit board having a cavity formed within said printed circuit board;
   a leadframe having a leadframe paddle and a plurality of leads attached to said leadframe paddle, said leadframe paddle being situated within said cavity;
   said plurality of leads being flush with a top surface of said printed circuit board;
   a reference plane within said printed circuit board, said reference plane situated at a predetermined distance below said plurality of leads;
   each of said plurality of leads having a respective total lead length, a respective encased lead length, and a respective free space lead length;
   said predetermined distance, said respective total lead length, said respective encased lead length, and said respective free space lead length being selected so as to cause each of said plurality of leads to have a controlled impedance.

14. The structure of claim 13 wherein said reference plane is a ground plane.

15. The structure of claim 14 wherein said leadframe paddle is an exposed paddle and wherein a bottom surface of said exposed paddle is attached to said ground plane.

16. The structure of claim 14 wherein said printed circuit board has a first desired dielectric constant, said first desired dielectric constant is selected so as to result in said controlled impedance of each of said plurality of leads.

17. The structure of claim 14 wherein said cavity is encased in a mold compound.

18. The structure of claim 17 wherein said mold compound has a second desired dielectric constant, said second desired dielectric constant is selected so as to result in said controlled impedance of each of said plurality of leads.

19. The structure of claim 16 wherein said cavity is encased in a mold compound.

20. The structure of claim 19 wherein said mold compound has a second desired dielectric constant, said second desired dielectric constant is selected so as to result in said controlled impedance of each of said plurality of leads.

21. A structure comprising:
- a printed circuit board having a cavity formed within said printed circuit board;
- a leadframe having a leadframe paddle and at least one lead, said leadframe paddle being situated within said cavity;
- said at least one lead being flush with a top surface of said printed circuit board;
- a reference plane within said printed circuit board, said reference plane situated at a predetermined distance below said at least one lead so as to result in a controlled impedance of said at least one lead,
- wherein said reference plane is a ground plane,
- wherein said printed circuit board has a first desired dielectric constant, said first desired dielectric constant is selected so as to result in said controlled impedance of said at least one lead.

22. The structure of claim 21 wherein said cavity and a portion of said at least one lead are encased in a mold compound.

23. The structure of claim 22 wherein said mold compound has a second desired dielectric constant, said second desired dielectric constant is selected so as to result in said controlled impedance of said at least one lead.

24. A structure comprising:
- a printed circuit board having a cavity formed within said printed circuit board;
- a leadframe having a leadframe paddle and at least one lead, said leadframe paddle being situated within said cavity;
- said at least one lead being flush with a top surface of said printed circuit board;
- a reference plane within said printed circuit board, said reference plane situated at a predetermined distance below said at least one lead so as to result in a controlled impedance of said at least one lead,
- wherein said reference plane is a ground plane,
- wherein said cavity is encased in a mold.

25. The structure of claim 24 wherein said mold compound has a second desired dielectric constant, said second desired dielectric constant is selected so as to result in said controlled impedance of said at least one lead.

26. The structure of claim 24 wherein a total lead length of said at least one lead is selected so as to result in said controlled impedance of said at least one lead.

27. The structure of claim 24 wherein an encased lead length of said at least one lead is selected so as to result in said controlled impedance of said at least one lead.

28. The structure of claim 24 wherein a free space lead length of said at least one lead is selected so as to result in said controlled impedance of said at least one lead.

29. The structure of claim 24 wherein a lead width of said at least one lead is selected so as to result in said controlled impedance of said at least one lead.

* * * * *